United States Patent [19]
Iino et al.

[11] Patent Number: 5,720,809
[45] Date of Patent: Feb. 24, 1998

[54] CRUCIBLE FOR PULLING SILICON SINGLE CRYSTAL

[75] Inventors: Eiichi Iino; Kiyotaka Takano; Izumi Fusegawa; Hirotoshi Yamagishi, all of Gunma-ken, Japan

[73] Assignee: Shin-Etsu Handotai Co., Ltd., Tokyo, Japan

[21] Appl. No.: 510,436

[22] Filed: Aug. 2, 1995

Related U.S. Application Data

[63] Continuation of Ser. No. 190,604, Feb. 2, 1994, abandoned.

[30] Foreign Application Priority Data

Feb. 4, 1993 [JP] Japan ................ 5-040474

[51] Int. Cl.$^6$ ................ C30B 15/02
[52] U.S. Cl. ................ 117/213; 117/31; 117/900; 117/932
[58] Field of Search ................ 117/31, 900, 932, 117/213

[56] References Cited

U.S. PATENT DOCUMENTS

| | | | |
|---|---|---|---|
| 4,609,425 | 9/1986 | Mateika et al. | 156/617 SP |
| 4,894,206 | 1/1990 | Yamashita et al. | 117/213 |
| 4,911,895 | 3/1990 | Kida et al. | 422/245 |
| 4,979,973 | 12/1990 | Takita et al. | 501/12 |
| 4,980,015 | 12/1990 | Ono et al. | 117/213 |
| 5,053,359 | 10/1991 | Loxley et al. | 501/4 |
| 5,141,786 | 8/1992 | Shimizu et al. | 501/12 |
| 5,174,801 | 12/1992 | Matsumura et al. | 65/18.1 |
| 5,196,173 | 3/1993 | Arai et al. | 117/213 |
| 5,270,020 | 12/1993 | Suzuki et al. | 422/248 |
| 5,326,729 | 7/1994 | Yaba et al. | 501/54 |
| 5,361,721 | 11/1994 | Takano et al. | 117/214 |
| 5,364,433 | 11/1994 | Nishimura et al. | 501/54 |

FOREIGN PATENT DOCUMENTS 4212580  4/1992  Germany ................ C30B 15/10

*Primary Examiner*—Robert Kunemund
*Attorney, Agent, or Firm*—Ronald R. Snider

[57] ABSTRACT

A double-wall crucible is disclosed which is constructed by coaxially disposing a cylindrical partition wall in an outer crucible for holding a molten mass of silicon as a raw material and operated by heating the outer crucible and meanwhile supplying the raw material silicon to the gap between the outer crucible and the cylindrical partition wall and introducing the consequently produced molten mass of silicon to the interior of the cylindrical partition wall through a passage below the level of the molten mass of silicon interconnecting the outer crucible and the inner side of the cylindrical partition wall and meanwhile pulling a single crystal bar from the molten mass of silicon in the cylindrical partition wall. In this double-wall crucible, at least the cylindrical partition wall is formed of quartz glass having a hydroxyl group (OH group) content of not more than 30 ppm. In the crucible of this invention, the produced silicon single crystal enjoys improved quality and the operation of pulling enjoys enhanced yield because the cylindrical partition wall is softened or deformed only sparingly by the intense heat emanating from the molten mass of silicon. Since the cylindrical partition wall does not readily soften or deform on exposure to the heat, the partition wall can be fixed in place with a simple construction and the whole apparatus for the operation of pulling enjoys simplicity of construction and low cost of production.

1 Claim, 1 Drawing Sheet

CRUCIBLE FOR PULLING SILICON SINGLE CRYSTAL

This application is a continuation of application Ser. No. 08/190,604, filed Feb. 2, 1994, now abandoned.

BACKGROUND OF THE INVENTION

1. Field of the Invention

This invention relates to a double-wall crucible to be used in pulling a silicone single crystal.

2. Description of the Prior Art

Heretofore, the Czochralski method has been prevalently adopted for the operation of pulling a silicon single crystal.

As a version developed from this method, the method which adopts a double-wall crucible formed by disposing a cylindrical partition wall in an outer crucible and operates the crucible by supplying solid (particulate or granular) or fused silicon as a raw material batchwise or continuously into the crucible through a gap between the inner surface of the outer crucible and the outer surface of the cylindrical partition wall and pulling a silicon single crystal from the molten mass of silicon in the cylindrical partition wall has been arresting attention.

This pulling method is expected to serve not only as means for uniformizing the concentration of such a doping impurity as boron, antimony, or phosphorus in a silicon single crystal being pulled for the sake of precluding the resistivity of the single crystal bar from being altered by the possible segregation of the impurity mentioned above but also as means for improving the productivity of the operation and enhancing the yield thereof and consequently lowering the cost of production by pulling the single crystal bar while continuing the supply of raw material.

A typical example of the construction of the double-wall crucible i of this invention is illustrated in FIG. 1 and FIG. 2.

An outer crucible 3 by nature is fated to support a very heavy and hot molten mass 21 of silicon at all times. In order to prevent the outer crucible 3 from sustaining any thermal deformation or damage and, even if the damage should occur, preclude the molten mass 21 from leaking out of the apparatus for pulling a single crystal, the into crucible 3 is protected by a container 2 made of graphite.

A cylindrical partition wall 5 or 12 which is a cylindrical container disposed coaxially inside the outer crucible 3 is generally manufactured in a cylindrical form. The cylindrical partition wall 5, as illustrated in FIG. 1, is so constructed that the lower end part thereof is not fixed to the inner bottom wall of the outer crucible 3 but is suspended in the molten silicon. The cylindrical partition wall 12, as illustrated in FIG. 2, is so constructed that the lower end part thereof is fused to the outer crucible 3 and the partition wall 12 proper is provided in the lower part thereof with through holes 11 adapted to pass the molten silicon.

Generally, the cylindrical partition wall is formed of quartz glass because quartz glass exhibits ample resistance to heat and excellent moldability as compared with other materials and has an extremely small content of impurities detrimental to silicon single crystal.

Incidentally, the molten mass of silicon prepared in the crucible to be pulled generally has a high temperature in the neighborhood of 1450° C. The conventional quartz glass offers no ample resistance to the heat of the molten mass of silicon and tends to soften or deform on contact therewith. To make up this deficiency, therefore, the outer crucible 3 receives protection from the container 2 made of graphite as described above. When the cylindrical partition wall has no such protecting means as mentioned above, it deforms conspicuously while the singlecrystal is being pulled therein.

This deformation of the cylindrical partition wall results first of all in obstructing securement of a space for pulling a single crystal. Even when the deformation has not yet grown to an appreciable extent, it is still at a disadvantage in producing a turbulent stream in the molten mass of silicon, causing contamination of the molten mass of silicon with extraneous matter, and degrading the quality of the single crystal. Moreover, this deformation curtails the service life of the double-wall crucible itself.

It is conceivable to modify the construction of the cylindrical partition wall or devise a stationary clasp of special construction for the purpose of coping with the softening and deformation of the cylindrical partition wall. This approach, however, has the disadvantage that the apparatus for pulling a silicon single crystal is rendered complicated and expensive.

SUMMARY OF THE INVENTION

This invention aims to solve the problem mentioned above. It is an object of this invention to provide a double-wall crucible for the operation of pulling a silicon single crystal, which double-wall crucible represses the softening and deformation of the cylindrical partition wall made of quartz glass, prevents the molten mass of silicon from producing a turbulent stream in itself during the growth of a single crystal, allows production of a single crystal of excellent quality by the operation of pulling, elongates the service life of the cylindrical partition wall owing to the successful repression of the softening and deformation, and enables the entire apparatus for the operation of pulling to be obtained in a simple construction inexpensively by simplifying a structure of a supporting means for the cylindrical partition wall.

Specifically, this invention is directed to a double-wall crucible to be constructed by coaxially disposing a cylindrical partition wall inside an outer crucible for holding a molten mass of silicon as a raw material and operated by heating the outer crucible and meanwhile supplying the raw material silicon to the gap between the outer crucible and the cylindrical partition wall and introducing the consequently produced molten mass of silicon into the interior of the cylindrical partition wall via a passage below the surface of the molten mass interconnecting the outer crucible and the inside of the cylindrical partition wall and meanwhile pulling the single crystal bar from the molten mass of silicon inside the cylindrical partition wall, which double-wall crucible is characterized in that at least the cylindrical partition wall is formed of quartz glass having a hydroxyl group (OH group) content of not more than 30 ppm.

BRIEF DESCRIPTION OF THE DRAWINGS

This invention will be better understood and the objects and features thereof other than those set forth above will become apparent when consideration is given to the following detailed description thereof, which makes reference to the annexed drawings wherein.

DETAILED DESCRIPTION OF THE PREFERRED EMBODIMENTS

In the crucible of this invention to be used for the operation of pulling a silicon single crystal, since the material of which the cylindrical partition wall is formed of quartz glass having a hydroxyl group content of not more than 30 ppm, the cylindrical partition wall softens or deforms only very little. When the outer crucible is also formed of the same material, the service life of the double-wall crucible is further elongated.

The object of this invention is no longer accomplished when the hydroxyl group content of the quartz glass exceeds 30 ppm. For the purpose of improving the ability of the cylindrical partition wall to resist heat and exalting the quality (yield) of the silicon single crystal, the quartz glass is desired to have a low hydroxyl group content. If the hydroxyl group content is excessively low, the cylindrical partition wall of quartz glass becomes expensive. The hydroxyl group content,. therefore, is decided in consideration of the balance between the quality of the silicon single crystal to be produced and the cost of production of the cylindrical partition wall.

Now, this invention will be described below with reference to the accompanying drawings.

Figure 1:
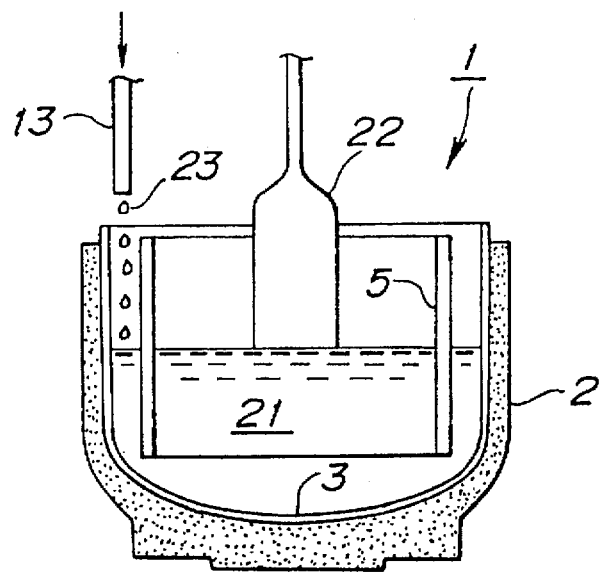
FIG. 1 is a longitudinal cross section illustrating one example of the crucible of this invention for the operation of pulling a silicon single crystal.

A crucible (double-wall crucible) 1 for the operation of pulling a silicon single crystal illustrated in FIG. 1 is constructed by coaxially disposing a cylindrical partition wall 5 made of quartz glass in an outer crucible (made of quartz glass) inserted fast in a container 2 made of graphite and, at the same time, suitably interposing a gap between the lower end part of the cylindrical partition wall 5 and the bottom surface of the outer crucible 3. The cylindrical partition wall 5 is formed of quartz glass having a hydroxyl group content of not more than 30 ppm.

The outer crucible 3 is supported by the container 2 of graphite in such a manner as to be vertically reciprocated and rotated and the cylindrical partition wall 5 is supported so as to be vertically reciprocated by a supporting member (not shown) disposed above the crucible 1 for pulling.

In this crucible 1 for pulling, a solid or molten silicon 23 as the raw material is continuously introduced through an introduction tube 13 into the gap between the inner surface of the outer crucible 3 and the outer surface of the cylindrical partition wall 5 and transformed therein into a molten mass. Then, with the outer crucible 3 and a silicon single crystal 22 kept rotated in opposite directions relative to each other, the silicon single crystal 22 is pulled from the molten mass 21 of silicon held inside the cylindrical partition wall 5. In this case, the level of the molten mass 21 inside the cylindrical partition wall 5 can be maintained at a fixed height by making up the fall of the level of the molten mass 21 attendant on the pull of the silicon single crystal 22 by the continuous supply of the silicon 23 as the raw material.

Figure 2:
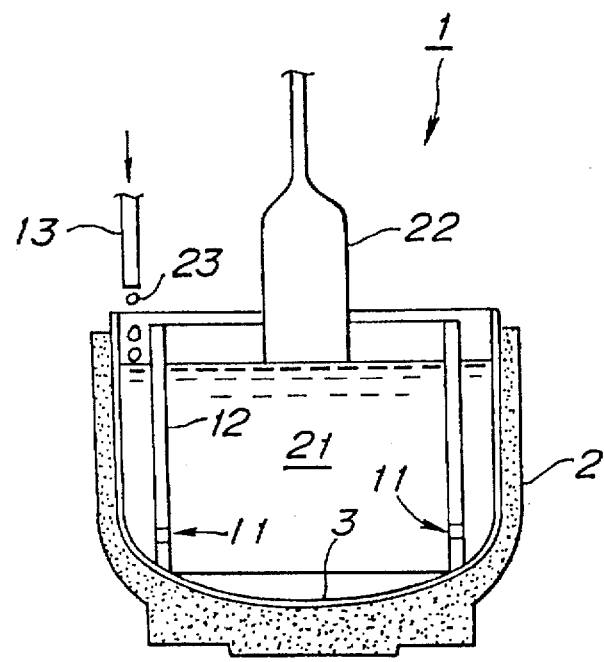
FIG. 2 is a longitudinal cross section illustrating another example of the crucible for the operation of pulling a silicon single crystal.

In the crucible 1 for pulling illustrated in FIG. 2, the cylindrical partition wall 12 provided in the lower part thereof with a plurality of through holes 11 is coaxially disposed inside the outer crucible 3 in the place of the cylindrical partition wall 5 used in the crucible of FIG. 1 and the lower end part of the cylindrical partition wall 12 is fixed to the bottom surface of the outer crucible 3.

In this crucible 1 for pulling, the solid or molten silicon 23 as the raw material is continuously introduced through the introduction tube 13 into the gap between the inner surface of the outer crucible 3 and the outer surface of the cylindrical partition wall 12 and transformed therein into a molten mass. The molten mass is supplied via the through holes 11 to the interior of the cylindrical partition wall 12. From the molten mass 21 of silicon held inside the cylindrical partition wall 12, the silicon single crystal 22 is pulled in the same manner as illustrated in FIG. 1.

Now, this invention will be described below with reference to a working example and a comparative experiment.

Example:

The double-wall crucible 1 illustrated in FIG. 2 was used to pull a silicon single crystal under the conventional conditions according with the Czochralski method.

The outer crucible 3 measuring 450 mm in diameter was made of quartz glass having a hydroxyl group content of 180 ppm and the cylindrical partition wall 12 measuring 350 mm in diameter was made of quartz glass having a hydroxyl group content of 20 ppm.

By the use of this double-wall crucible, two silicon single crystals 125 mm in diameter and two silicon single crystals 150 mm in diameter were continuously pulled.

Even when the crucible was continuously used for not less than 120 hours after the start of melting of silicon as the raw material, only slight deformation was found in the cylindrical partition wall 12. The deviations of diameter of the cylindrical partition wall 12 from the initial values were invariably within 1 cm. All of the silicon single crystals thus produced by the pulling showed no sign of dislocation.

Comparative Experiment:

The double-wall crucible 1 illustrated in FIG. 2 was used to pull silicon single crystals under the same conditions as used in the above Example.

The outer crucible 3 measuring 450 mm in diameter was made of quartz glass having a hydroxyl group content of 180 ppm and the cylindrical partition wall 12 measuring 350 mm in diameter was made of quartz glass having a hydroxyl group content of 60 ppm.

By the use of this double-wall crucible, one silicon single crystal 125 mm in diameter and one silicon single crystal 150 mm in diameter were pulled.

When the silicon raw material began to melt, no deformation was found in the cylindrical partition wall 12. Conspicuous deformation was found therein, however, after the elapse of about 20 hours following the start of melting. As respects the quality of the silicon single crystal, no sign of dislocation was found in the crystal before the cylindrical partition wall 12 began to deform. After the cylindrical partition wall began to deform conspicuously, dislocation occurred in the crystal.

It is clearly noted from the description given thus far that since at least the cylindrical partition wall in the double-wall crucible of this invention for the operation of pulling a silicon single crystal is formed of quartz glass having a hydroxyl group content of not more than 30 ppm, the cylindrical partition wall is only sparingly softened or deformed by the heat emanating from the molten mass of silicon. Thus, the present invention is effective In exalting the quality of the silicon single crystal and enhancing the yield of the pulling operation.

Further, since the cylindrical partition wall does not readily soften or deform on exposure to the intense heat of the molten mass of silicon, it can be fixed in place with a simple construction. As a result, the whole apparatus for the pulling operation enjoys simplicity of construction and low cost of production.

What is claimed is:

1. A double-wall crucible constructed by coaxially disposing a cylindrical partition wall inside an outer crucible for holding a molten mass of silicon as a raw material and operated by heating said outer crucible and meanwhile supplying the raw material silicon to a gap between said outer crucible and said cylindrical partition wall and introducing the consequently produced molten mass of silicon into the interior of said cylindrical partition wall via a passage below the level of said molten mass interconnecting said outer crucible and the inside of said cylindrical partition wall and meanwhile pulling a single crystal bar from said molten mass of silicon inside said cylindrical partition wall, which double-wall crucible is characterized in that at least said cylindrical partition wall is formed of quartz glass having a hydroxyl group (OH group) content of not more than 30 ppm; and wherein said cylindrical wall partition rests on the outer crucible, has a self-supporting wall, and has no support for said cylindrical wall between the outer crucible wall(s) and said cylindrical wall portion.

* * * * *